(12) United States Patent
Nickel

(10) Patent No.: US 6,633,497 B2
(45) Date of Patent: Oct. 14, 2003

(54) RESISTIVE CROSS POINT ARRAY OF SHORT-TOLERANT MEMORY CELLS

(75) Inventor: Janice H. Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 21 days.

(21) Appl. No.: 09/887,314

(22) Filed: Jun. 22, 2001

(65) Prior Publication Data

US 2002/0196647 A1 Dec. 26, 2002

(51) Int. Cl.[7] .............................................. G11C 11/00
(52) U.S. Cl. ....................................... 365/158; 365/209
(58) Field of Search .................................. 365/158, 209

(56) References Cited

U.S. PATENT DOCUMENTS 5,861,328 A * 1/1999 Tehrani et al. ............... 438/131
5,981,297 A * 11/1999 Baselt ........................ 209/214
6,055,178 A * 4/2000 Naji ............................ 365/158
6,331,944 B1 * 12/2001 Monsma et al. ............ 365/171
2001/0024380 A1 * 9/2001 Goebel et al. .............. 365/158

OTHER PUBLICATIONS

U.S.S.N. 09/663,752 filed Sep. 15, 2000 and entitled "Short-tolerant resistive cross point array" (Attorney docket PDNO 10001383–1).

* cited by examiner

Primary Examiner—Hoai Ho

(57) ABSTRACT

A data storage device includes a resistive cross point array of memory cells. Each memory cell includes a memory element and electrically conductive hard mask material on the memory element. The data storage device may be a Magnetic Random Access Memory ("MRAM") device.

11 Claims, 6 Drawing Sheets

RESISTIVE CROSS POINT ARRAY OF SHORT-TOLERANT MEMORY CELLS

BACKGROUND OF THE INVENTION

The present invention relates to data storage devices. More specifically, the present invention relates to a data storage device including a resistive cross point array of memory cells.

A typical Magnetic Random Access Memory ("MRAM") device includes an array of memory cells, word lines extending along rows of the memory cells, and bit lines extending along columns of the memory cells. Each memory cell is located at a cross point of a word line and a bit line.

The memory cells may include spin dependent tunneling ("SDT") junctions. The magnetization of an SDT junction assumes one of two stable orientations at any given time. These two stable orientations, parallel and anti-parallel, represent logic values of '0' and '1.' The magnetization orientation, in turn, affects the resistance of the SDT junction. The resistance of the SDT junction is a first value if the magnetization orientation is parallel and a second value if the magnetization orientation is anti-parallel.

The logic state of an SDT junction may be read by sensing the resistance state of the SDT junction. However, in some architectural configurations, the memory cells in the array are coupled together through many parallel paths. The resistance seen at one cross point equals the resistance of the memory cell at that cross point in parallel with resistances of memory cells in the other rows and columns. In this regard, the array of memory cells may be characterized as a cross point resistor network.

A typical SDT junction has a tunneling barrier that is only a few atoms thick. Controlling the fabrication process to produce such thin barriers for an entire array of memory cells is difficult. It is possible that some of the barriers will be thinner than designed and contain structural defects. If certain SDT junctions have tunneling barriers that are defective or thinner than designed, those SDT junctions might be shorted.

If one SDT junction is shorted, the shorted SDT junction will be unusable. In a resistive cross point array that does not use switches or diodes to isolate memory cells from one another, the other memory cells in the same column and row will also be rendered unusable. Thus, a single shorted SDT junction memory cell can cause a column-wide error and a row-wide error.

Error code correction could be used to recover data from a complete column or row of unusable memory cells. However, correcting a thousand or more bits in a single column or row is costly, both from a time standpoint and a computational standpoint. Moreover, a typical storage device might have more than one column and row with a shorted SDT junction.

There is a need to overcome the problems associated with shorted SDT junctions in resistive cross point memory arrays that do not use isolation devices such as diodes and transistors.

SUMMARY OF THE INVENTION

According to one aspect of the present invention, a data storage device includes a resistive cross point array of memory cells. Each memory cell includes a memory element and an electrically conductive hard mask material on the memory element. The hard mask material functions as a resistive element in series with the memory element. If a memory element becomes shorted, the shorted memory element will cause only a randomized bit error. However, the hard mask prevents the shorted memory element from causing column-wide and row-wide errors.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 2b is a diagram of an electrical equivalent of a memory cell shown in FIG. 2a.

DETAILED DESCRIPTION OF THE INVENTION

Figure 1:
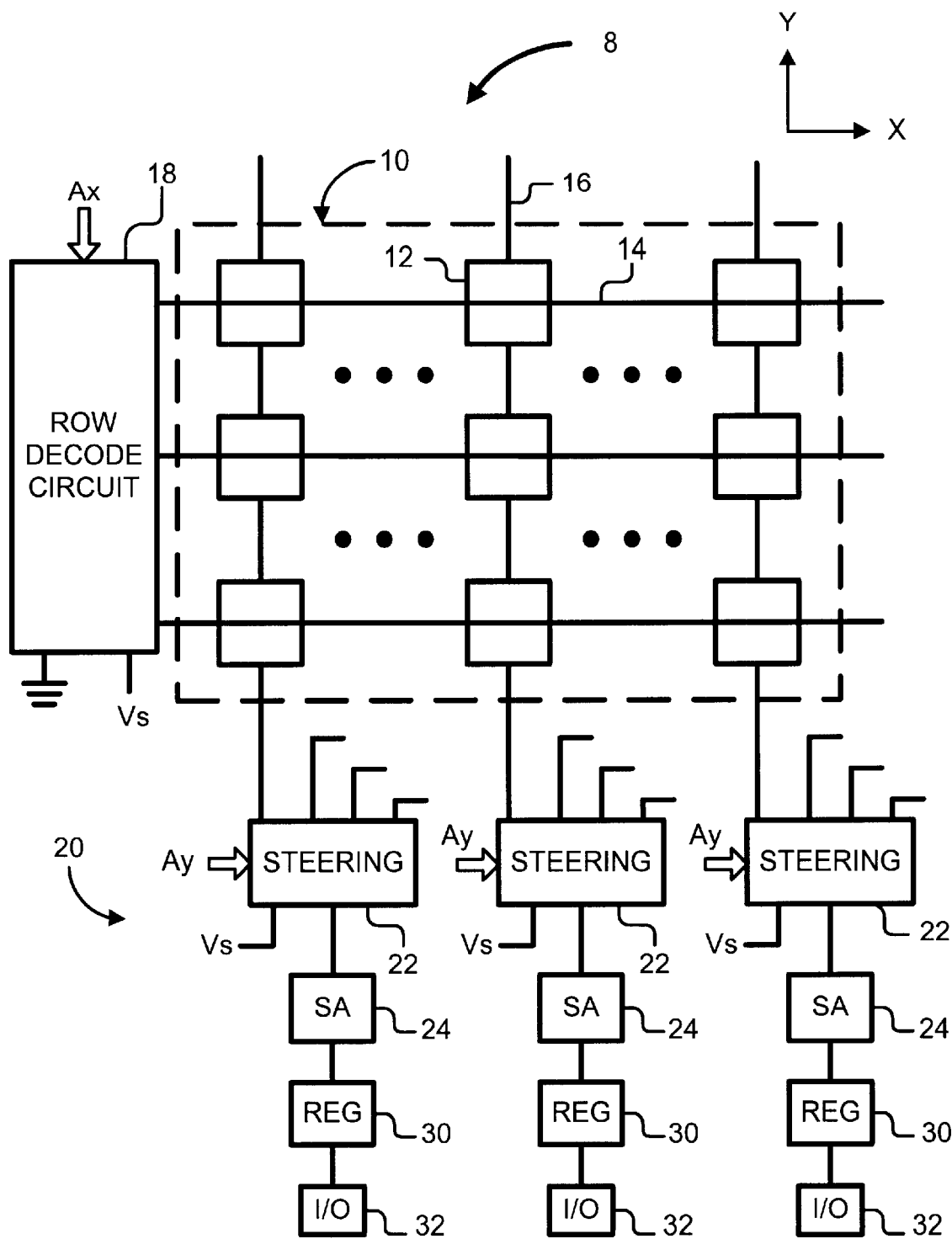
FIG. 1 is an illustration of an MRAM device including a memory cell array.

As shown in the drawings for purposes of illustration, the present invention is embodied in an MRAM device including a resistive cross point array of memory cells. The MRAM device does not include switches or diodes for isolating memory cells from one another during read operations. Instead, the a selected memory cell is isolated by applying an equal potential to selected and certain unselected word and bit lines. Applying the equal potential can prevent parasitic currents from interfering with the read operations.

During fabrication of the memory array, a hard mask is deposited on a stack of magnetic memory layers and used to pattern the stack into memory elements. Use of the hard mask reduces edge roughness of the memory elements. Edge roughness of the memory elements causes pinning of domain walls, and irregular nucleation of switching. This irregularity and pinning can cause different memory elements to switch at different fields, increasing the variation in switching field. Reducing the distribution in switching fields (or coercivity) reduces the requirements on half select, and potentially reduces the required switching fields. Improving coercivity distribution reduces switching errors.

Using an electrically conductive hard mask provides a dual benefit. Hard mask material remaining on the memory elements after patterning is not removed. The hard mask material is allowed to remain and function as in-series resistive elements for the memory elements. If a memory element becomes shorted, the shorted memory element will cause a randomized bit error. However, the hard mask material prevents the shorted memory element from causing column-wide and row-wide errors. The randomized bit failure can be corrected by ECC far more quickly and easily than a column-wide or row-wide failure. Thus the memory cells may be made short-tolerant without adding any fabrication steps.

Reference is now made to FIG. 1, which illustrates an MRAM device 8 including an array 10 of memory cells 12. The memory cells 12 are arranged in rows and columns, with the rows extending along an x-direction and the columns extending along a y-direction. Only a relatively small number of memory cells 12 are shown to simplify the description of the device 8. In practice, arrays of any size may be used.

Traces functioning as word lines 14 extend along the x-direction in a plane on one side of the memory cell array 10. Traces functioning as bit lines 16 extend along the y-direction in a plane on an opposite side of the memory cell array 10. There may be one word line 14 for each row of the array 10 and one bit line 16 for each column of the array 10. Each memory cell 12 is located at a cross point of a corresponding word line 14 and bit line 16.

The MRAM device 8 also includes a row decode circuit 18. During read operations, the row decode circuit 18 may apply either a constant supply voltage (Vs) or a ground potential to the word lines 14. The constant supply voltage (Vs) may be provided by an external source.

The MRAM device 8 further includes a read circuit for sensing the resistance of selected memory cells 12 during read operations and a write circuit for orienting the magnetization of selected memory cells 12 during write operations. The read circuit is indicated generally at 20. The write circuit is not shown.

The read circuit 20 includes a plurality of steering circuits 22 and sense amplifiers 24. Multiple bit lines 16 are connected to each steering circuit 22. Each steering circuit 22 includes a set of switches that may connect each bit line 16 to a source of operating potential or a sense amplifier 24. An output of each sense amplifier 24 is supplied to a data register 30, which, in turn, is coupled to an I/O pad 32.

During read operations, an equal potential method is applied to the memory cell array 10, and the sense currents flowing through the selected memory cells 12 are sensed. The sense currents indicate the logic states of the selected memory cells 12. The equal potential method prevents parasitic currents from obscuring the sense currents and interfering with the read operations. Different variations of the equal potential method may be used. See, for example, the methods and corresponding hardware implementations in assignee's U.S. Ser. No. 09/564308 filed Mar. 3, 2000.

Figure 2A:
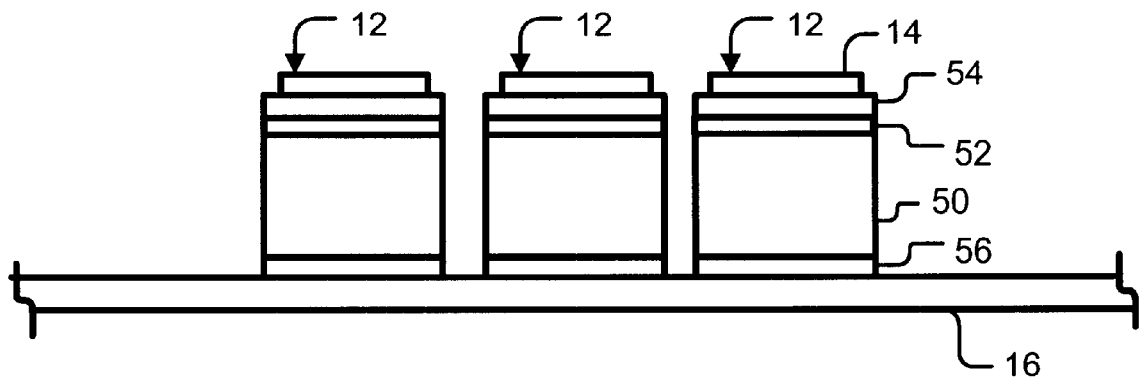
FIG. 2a is an illustration of three memory cells for the MRAM device.

FIG. 2a shows three memory cells 12 of a column of the array 10. Each memory cell 12 includes a memory element 50 that stores a bit of information as an orientation of a magnetization. The memory elements 50 are not limited to any particular type.

Each memory cell 12 further includes a film 52 of hard mask material on each memory element 50. The film 52 is electrically conductive, having a resistance between about 0.5% and 50% of design resistance of the memory element 50. The film 52 functions as a linear resistive element The film 52 is a remnant of a mask layer, which was used to pattern the elements 50 during device fabrication. These resistive elements are not formed on a silicon substrate. Therefore, they do not take up valuable silicon real estate.

Films 52 made of diamond-like carbon are preferred. The diamond-like carbon is thermally, electrically and structurally stable, even at temperatures as high as 400° C. Resistivity of the diamond-like carbon can be varied by orders of magnitude, depending upon deposition conditions. The resistivity of the diamond-like carbon can be varied by doping with nitrogen (N). The conductivity can be varied from 0.1 ohm-cm to $10^9$ ohm-cm, depending on the deposition conditions. Temperature, power and time all affect the properties, and individual deposition systems will be calibrated for the actual conductivity achieved during specific deposition conditions.

A mask made of diamond-like carbon produces memory elements 50 having consistent shape and uniformity. Consequently, magnetic switching properties of the memory elements are improved. The diamond-like carbon is a very flat material when deposited, and imparts very little topography to the memory cells 12.

A further advantage of the diamond-like carbon is that the films 52 can be made very thin, on the order of 10–100 nanometers. Resistors that are inherently thicker than diamond-like carbon would decrease the available field for switching.

Each memory cell 12 further includes a first ohmic contact 54 between its memory element 50 and a word line 14, and a second ohmic contact 56 between its memory element 50 and a bit line 16. The word and bit lines 14 and 16 are typically low resistance conductors made of a metal such as aluminum, copper or gold. The ohmic contacts 54 and 56 provide an interface between the metal lines 14 and 16 and the film 52 and the memory element 50. Although the first and second ohmic contacts 54 and 56 are shown as separate elements 52 and 54, it is understood that these separate elements 54 and 56 may be eliminated and the metal lines 14 and 16 may make direct contact with the films 52 and the memory elements 50.

The memory cells 12 are shown as being deposited on the bit lines (with the word lines 14 on top). However, the memory cells 12 may be deposited on a word line 14 (with the bit lines 16 on top).

Figure 2B:
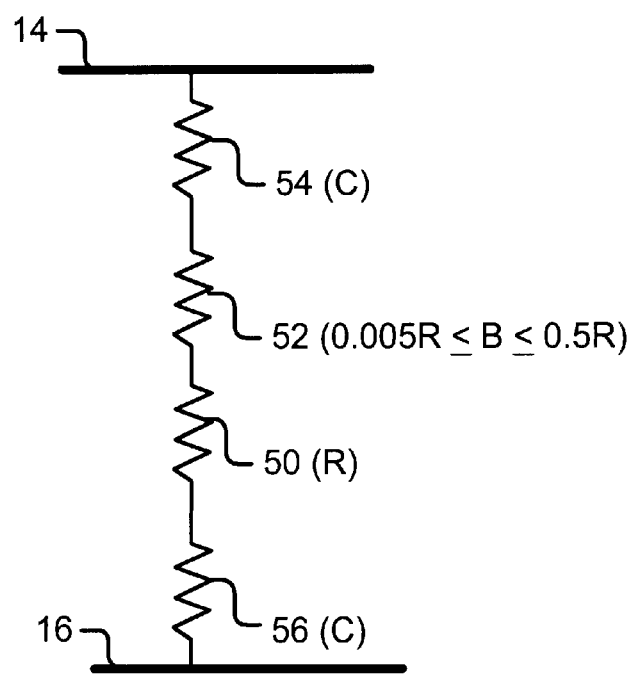

Referring additionally to FIG. 2b, resistance (B) of the film 52 may be between about 0.5% and 50% of design (i.e., intended) nominal resistance (R) of the memory element 50 (that is, $0.005R \leq B \leq 0.5R$). A narrower range would be between about 10% and 50% of nominal resistance (R) of the memory element 50 (that is, $0.1R \leq B \leq 0.5R$). For example, the memory element 50 has a design nominal resistance (R) of 1,000,000 ohms and a delta resistance ($\Delta R$) of 200,000 ohms. Using the narrower range, the film has a resistance (B) between 100,000 ohms and 500,000 ohms. Using the wider range, the film 52 has a resistance (B) between 5,000 ohms and 500,000 ohms. In contrast, the ohmic contacts 54 and 56 each have a resistance (C) of about ten ohms.

In general, the resistance of the film 52 should be low enough to have a minimal effect on read operations and high enough to have minimal effect on write operations. Thus, the actual resistance should isolate the shorted memory element 50 without degrading the sensing of selected memory cells 12, and without degrading properties of writing to the memory cells 12.

If a memory element 50 is shorted, the resistance of the memory cell 12 will be about equal to the resistance (B) of the film 52. The advantage of the film 52 during a read operation will now be illustrated in connection with FIGS. 3a and 3b.

Figure 3A:
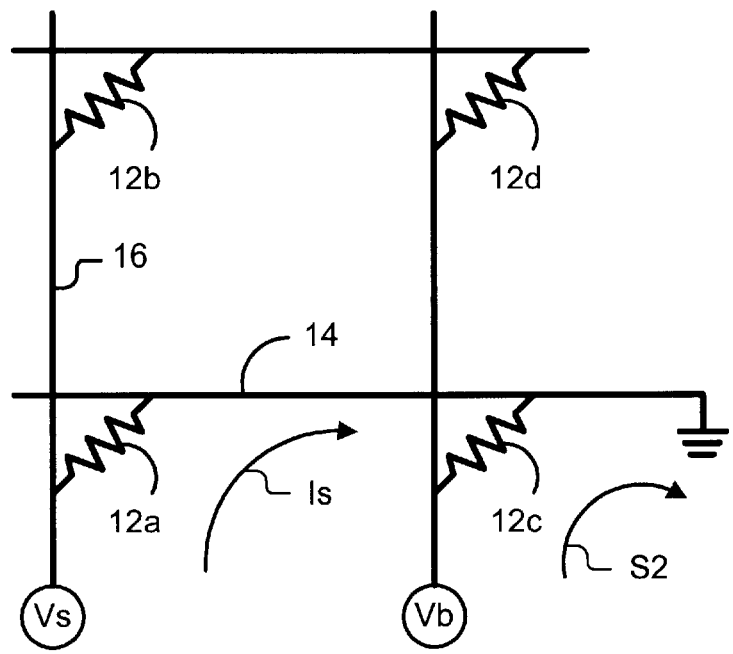
FIGS. 3a and 3b are illustrations of currents flowing through an electrical equivalent of the memory cell array during read operations on a selected memory cell.

FIG. 3a shows an electrical equivalent of a subset of the memory cell array 10 during a read operation. A selected memory cell is represented by a first resistor 12a, and unselected memory cells are represented by second, third and fourth resistors 12b, 12c and 12d. The second resistor 12b represents half-selected memory cells along the selected bit line, the third resistor 12c represents half-selected memory cells along the selected word line, and the fourth resistor 12d represents the remaining unselected memory cells. If, for example, all of the memory cells 12 have a resistance of about R+B and if the array 10 has n rows and m columns, then the second resistor 12b will have a resistance of about (R+B)/(n−1), the third resistor 12c will have a resistance of about (R+B)/(m−1), and the fourth resistor 12d will have a resistance of about (R+B)/[(n−1)(m−1)].

The first resistor 12a may be selected by applying an operating potential (Vs) to the crossing bit line and a ground potential to the crossing word line. Consequently, a sense current (Is) flows through the first resistor 12a.

To prevent sneak path currents from obscuring the sense current ($I_s$), an equal operating potential (Vb=Vs) is applied to the unselected bit line. Applying this equal potential (Vb) to the unselected bit line blocks the sneak path currents from flowing through the second and fourth resistors 12b and 12d and diverts to ground a sneak path current (S2) flowing through the third resistor 12c.

Figure 3B:
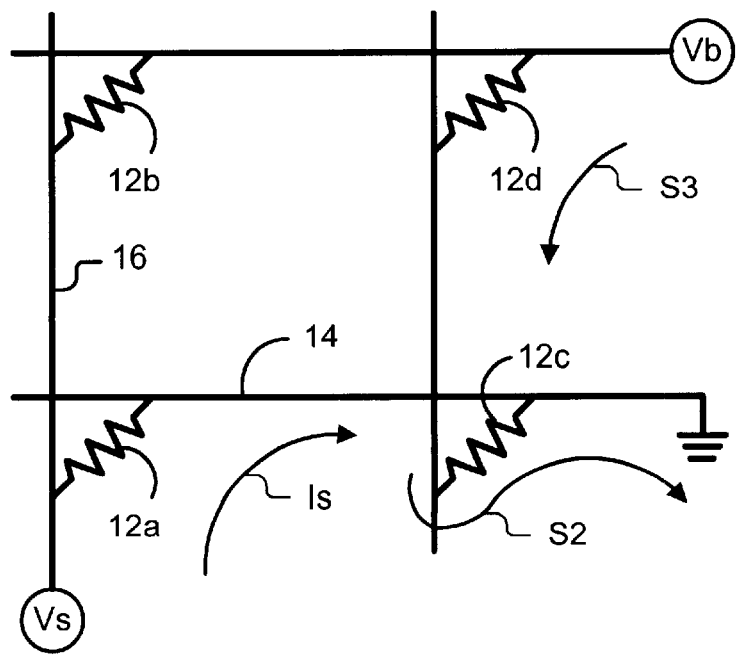
Figure 4:
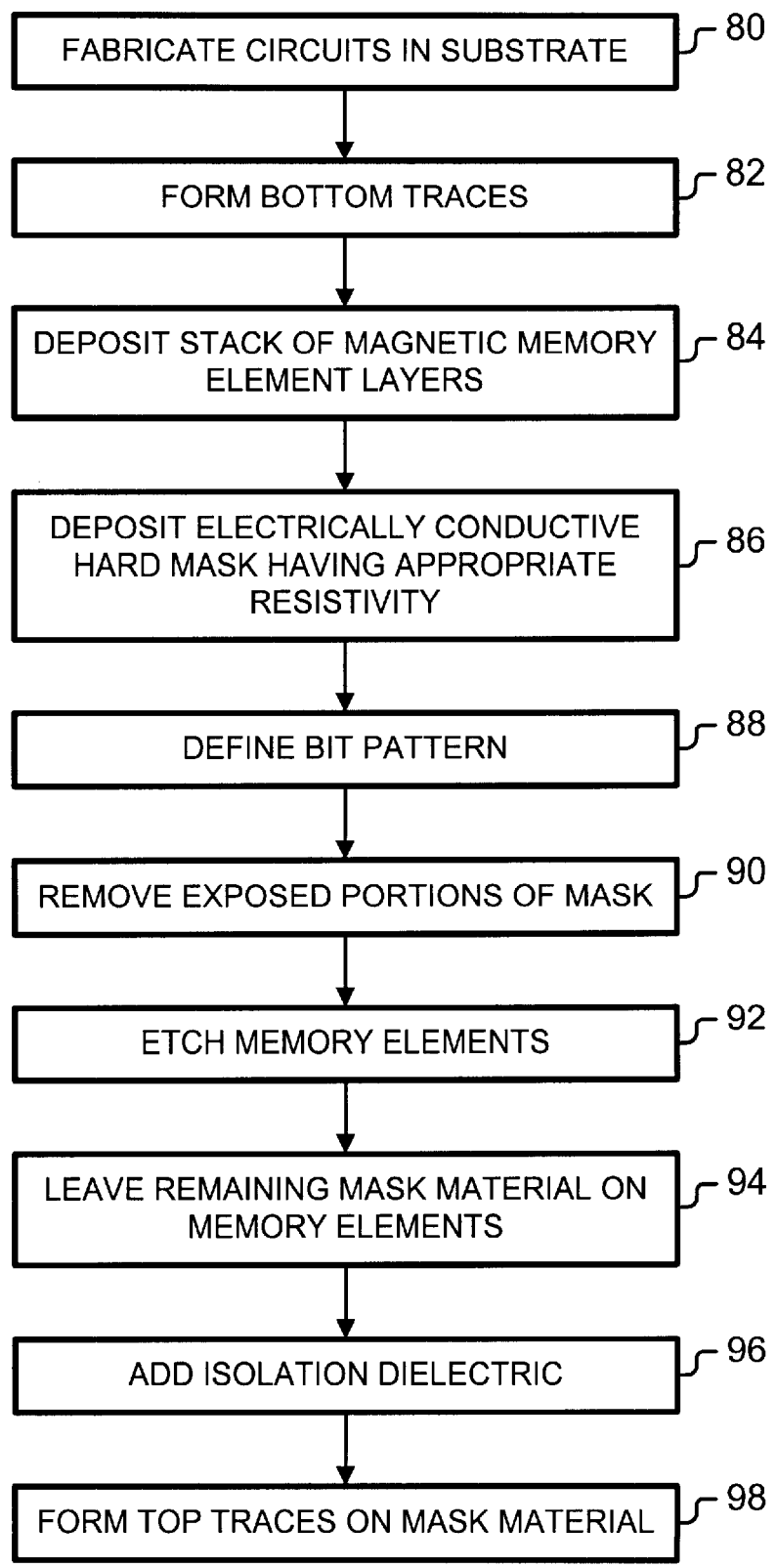
FIG. 4 is an illustration of a method of fabricating a first level of an MRAM chip.

The same operating potential (Vb=Vs) may be applied to the unselected word line instead of the unselected bit line, as shown in FIG. 3b. Applying this equal potential (Vb) to the unselected word line blocks the sneak path current from flowing through the second resistor 12b and diverts to ground the sneak path currents (S2 and S3) flowing through the third and fourth resistors 12c and 12d.

Ideal sense amplifiers 24 apply an equal potential to the selected bit line and the subset of unselected word and bit lines. If, however, the sense amplifiers 24 are not ideal, the potentials are not exactly equal and sneak path currents flow though the array 10 during read operations.

Consider a read operation on a selected memory cell 12 lying in the same column as a memory cell 12 having a shorted memory element 50. The half-selected memory cell 12 still has a resistance at least equal to the resistance (B) of its film 52. Even if the sense amplifiers 24 are not ideal, the half-selected memory cell 12 with the shorted memory element 50 does not divert a significant amount of sneak path current through the shorted memory element 50 and does not significantly affect the current sensing during read operations. As a result, the half-selected memory cell 12 does not cause row-wide and column-wide failures. Only a single randomized bit error results. The single randomized bit error can be corrected quickly and easily by error code correction.

The films 52 also increase the reliability of write operations on selected memory cells 12. Without the films 52, large write currents would flow through shorted memory elements 50. Moreover, the write currents would be diverted from the selected memory cell 12 to the shorted memory element 50, thereby reducing write currents and causing incorrect data to be written to the selected memory cells 12 in the same row or column. However, the films 52 have a high enough resistance to prevent large write currents from flowing through the shorted memory elements 50 and allowing sufficient write current to flow through the selected memory cells 12.

Reference is now made to FIGS. 4 and 5a–5c, which illustrate the fabrication of a first level of an MRAM device. The fabrication will be described in connection with SDT junctions.

Row decode circuits, steering circuits, sense amplifiers, registers and other memory device circuits are formed in a silicon substrate (80) Bottom traces are formed on the substrate (82). The traces may be formed by deposition or a demascene process.

A stack of magnetic memory element layers is deposited (84). The stack 110 for SDT junctions may include first and second seed layers 112 and 114, an antiferromagnetic ("AF") pinning layer 116, a pinned ferromagnetic ("FM") layer 118, an insulating tunnel barrier 120, and a sense FM layer 122 (see FIG. 5a). The first seed layer 112 allows the second layer 114 to be grown with a (111) crystal structure orientation, and the second seed layer 114 establishes a (111) crystal structure orientation for the AF pinning layer 116. The AF pinning layer 116 provides a large exchange field, which holds the magnetization of the pinned FM layer 118 in one direction. The sense FM layer 122 has a magnetization that is free to rotate in the presence of an applied magnetic field.

The insulating tunnel barrier 120 allows quantum mechanical tunneling to occur between the pinned and sense layers 118 and 122. This tunneling phenomenon is electron spin dependent, making the resistance of the SDT junction a function of the relative orientations of the magnetization of the pinned and sense layers 118 and 122.

An electrically conductive hard mask having appropriate resistivity is deposited on the stack (86). Resistivity can be controlled by deposition conditions.

A bit pattern is defined (88). Conventional photolithography or e-beam lithography may be used. Exposed portions of the mask are removed using, for example, a reactive ion etch with oxygen flow (90)

Figure 5A:
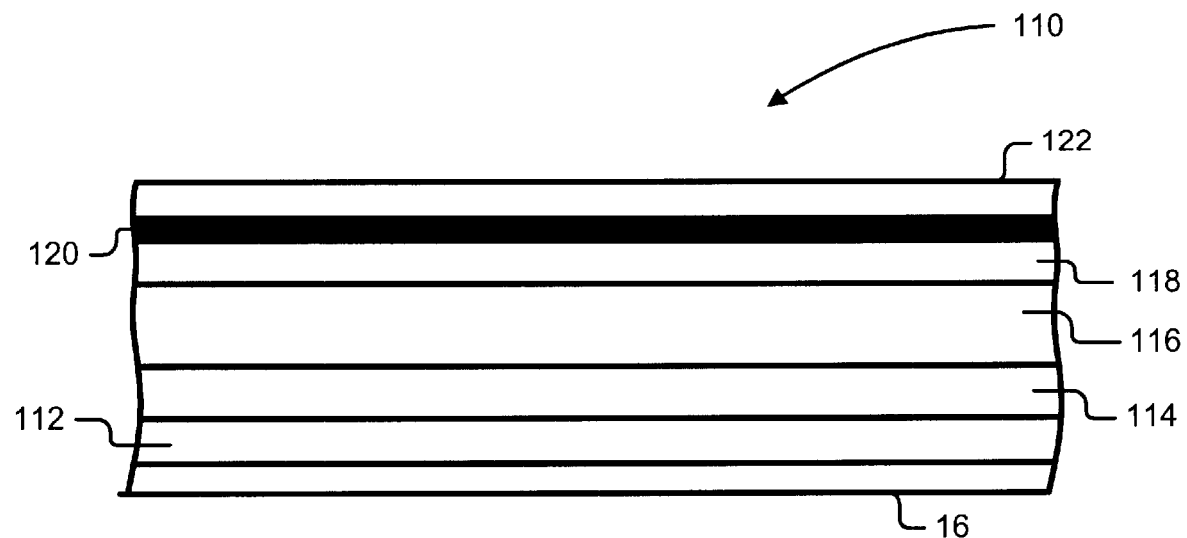
FIGS. 5a–5c are illustrations of a memory cell during various stages of fabrication.
Figure 5B:
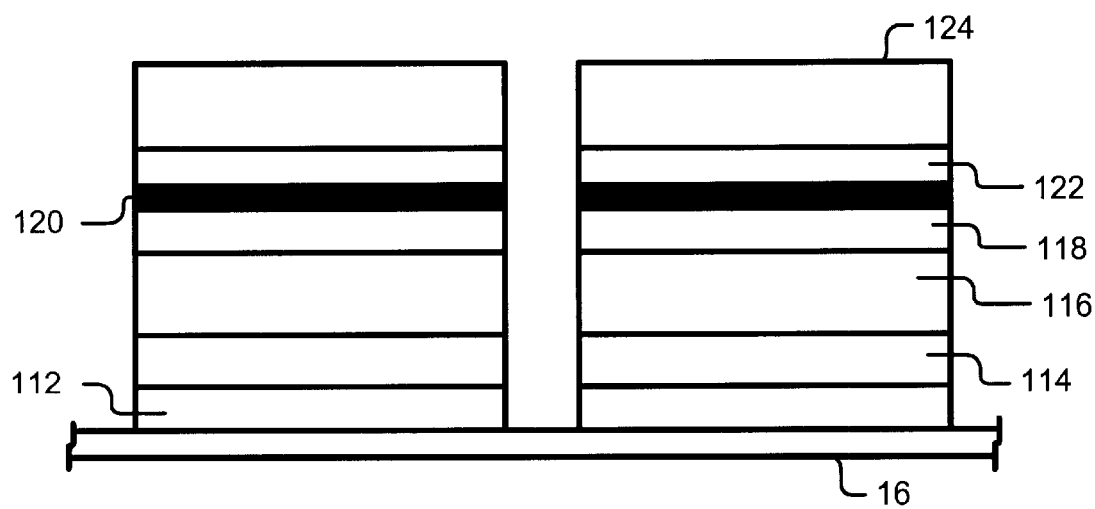

The memory elements 50 are etched (92). An ion or chemical etch may be used. The resulting structure is shown in FIG. 5b (the mask material is referenced by numeral 124).

Figure 5C:
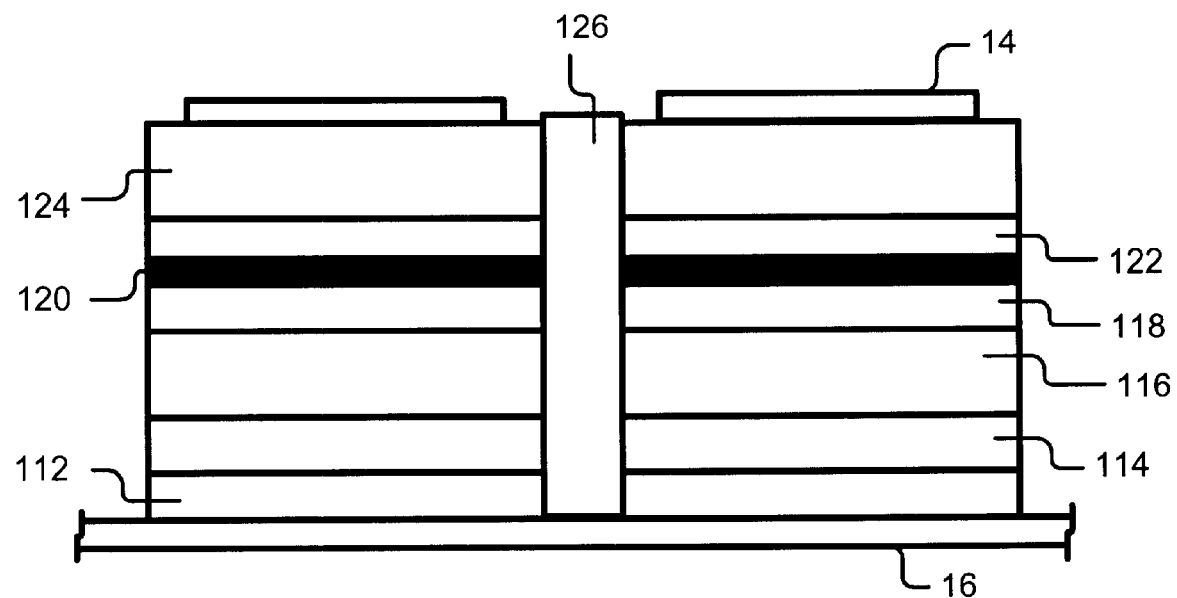

The mask material that remains is left on the memory elements (94). Gaps between the memory elements are filled in with an isolation dielectric (96), and top traces are deposited on the mask material and dielectric (98). The resulting first level is shown in FIG. 5c (the dielectric is referenced by numeral 126).

Figure 6:
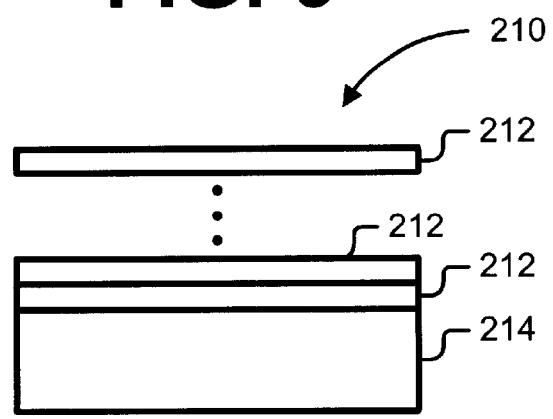
FIG. 6 is an illustration of an MRAM chip including multiple levels.

Referring to FIG. 6, additional levels 212 may be added to the MRAM chip 210. Each memory cell level 212 includes an array of memory cells. The memory cell levels 212 may be separated by insulating material (not shown) such as silicon dioxide. Read and write circuits may be fabricated on the substrate 214. The read and write circuits may include additional multiplexers for selecting the levels 212 that are read from and written to.

The MRAM device according to the present invention may be used in a variety of applications. For example, the MRAM device may be used for long term data storage in devices such as solid state hard drives and digital cameras.

The device is not limited to the specific embodiments described and illustrated above. For instance, the MRAM device has been described in connection with the rows being oriented along the easy axis. However, the rows and columns could be transposed.

The resistive cross point array is not limited to an array of magnetic memory cells. Memory elements of the memory cells may be of a phase-change material (resistance of phase-change elements is changed from one state to another by a phase alteration of the phase change material, such as a change from a crystalline state to an amorphous state), anti-fuse elements or polymer memory elements (data is stored as a 'permanent polarization' in a polymer molecule, and resistance of a polymer memory element is dependant upon the orientation of polarization of the polymer molecules).

The present invention is not limited to the specific embodiments described and illustrated above. Instead, the invention is construed according to the claims that follow.

What is claimed is:

1. A data storage device comprising a resistive cross point array of memory cells and a plurality of conductors, each memory cell including a memory element and electrically conductive hard mask material between the memory element and one of the conductors.

2. The device of claim 1, wherein the mask material is made of a diamond-like carbon.

3. The device of claim 1, wherein the mask material has a resistance between about 10% and 50% of design resistance of the memory elements.

4. The device of claim 1, wherein each memory element includes a spin dependent tunneling junction.

5. The device of claim 1, wherein the plurality of conductors include Word lines and bit lines for the array; the device further comprising a circuit for sensing resistance states of selected memory cells during read operations on the selected memory cells, the circuit applying a first potential to selected bit lines, a second potential to selected word lines and a third potential to subsets of unselected word and unselected bit lines, the third potential being equal to the first potential.

6. The device of claim 1, further comprising metalization on the mask material.

7. The device of claim 1, wherein each memory element includes a sense layer; and wherein for each memory cell, the mask material is in contact with the sense layer.

8. A memory cell of a data storage device, the memory cell comprising:

a memory element having a ferromagnetic layer and through-plane resistance; and an electrically conductive hard mask on a surface of the ferromagnetic layer.

9. The memory cell of claim 8, wherein the memory element includes a spin dependent tunneling junction.

10. The memory element of claim 8, wherein the film has a resistance between about 10% and 50% of design resistance of the memory element.

11. The memory cell of claim 8, wherein the ferromagnetic layer is a sense ferromagnetic layer.

* * * * *